(12) United States Patent
Sugiyama

(10) Patent No.: US 6,900,480 B2
(45) Date of Patent: May 31, 2005

(54) SOLID-STATE IMAGING DEVICE

(75) Inventor: Toshinobu Sugiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/341,707

(22) Filed: Jan. 14, 2003

(65) Prior Publication Data

US 2003/0136981 A1 Jul. 24, 2003

(30) Foreign Application Priority Data

Jan. 22, 2002 (JP) ........................................ 2002-012568

(51) Int. Cl.[7] ........................................... H01L 27/148
(52) U.S. Cl. ...................... 257/222; 257/292; 257/443
(58) Field of Search ................................. 257/222, 291, 257/292, 294, 443

(56) References Cited

U.S. PATENT DOCUMENTS

| | | | | |
|---|---|---|---|---|
| 5,796,154 A | * | 8/1998 | Sano et al. ................. | 257/432 |
| 6,288,388 B1 | * | 9/2001 | Zhang et al. ............ | 250/214.1 |
| 6,674,470 B1 | * | 1/2004 | Tanaka et al. .............. | 348/302 |
| 2003/0136981 A1 | * | 7/2003 | Sugiyama ................... | 257/222 |

* cited by examiner

*Primary Examiner*—Mark V. Prenty
(74) *Attorney, Agent, or Firm*—Robert J. Depke; Trexler, Bushnell, Giangiorgi, Blackstone & Marr, Ltd.

(57) ABSTRACT

A solid-state imaging device having, in each of unit pixels, an on-chip microlens composed of plural convex lens parts for each of photoelectric conversion elements provided on a semiconductor chip is disclosed. A floating diffusion part and a signal-charge read gate for taking out a signal charge from the photoelectric conversion element are provided on a region positioned in a boundary of each convex lens part of the on-chip microlens. A wiring for the floating diffusion part and a wiring for the read gate are provided along the respective boundaries of the convex lens parts of the on-chip microlens. In this device, the film thickness of the on-chip microlens can be reduced with regard to the area of each unit pixel, thereby facilitating the process control and enhancing the light transmission efficiency. It is also possible to enhance the circuit wiring efficiency in each unit pixel while avoiding any incomplete charge transfer to consequently improve the picture quality.

14 Claims, 5 Drawing Sheets

F I G. 2
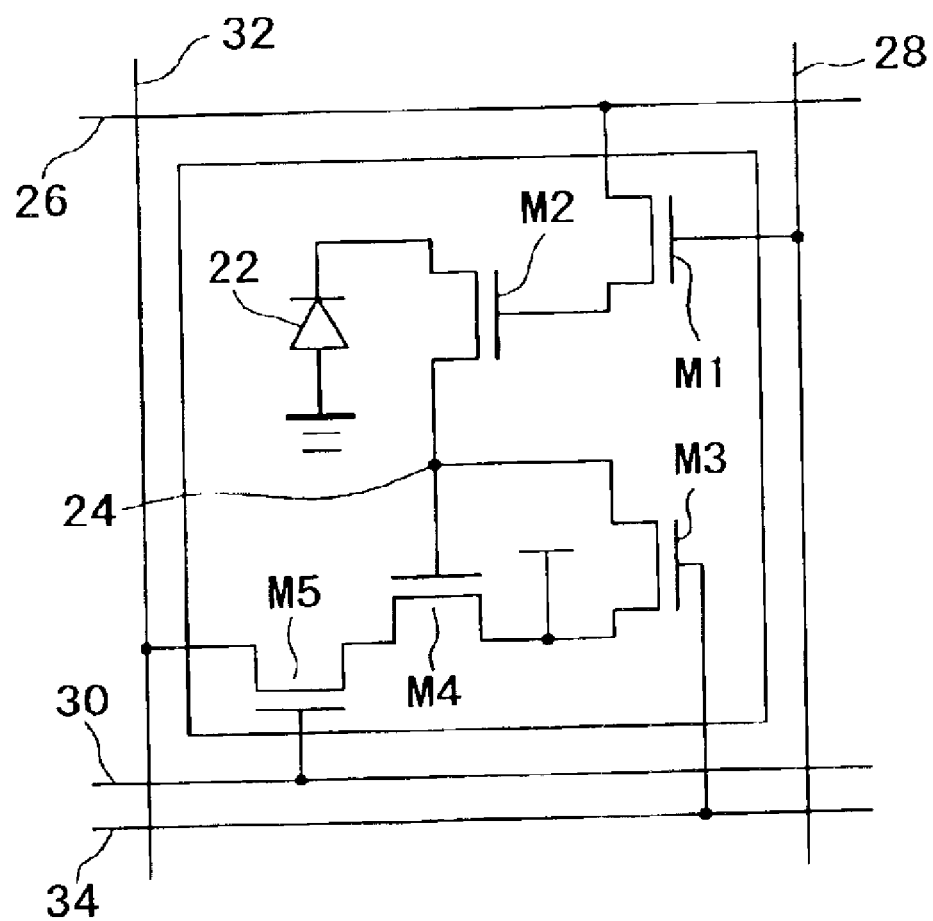

SOLID-STATE IMAGING DEVICE

This application claims priority to Japanese Patent Application Number JP2002-012568 filed Jan. 22, 2002, which is incorporated herein by reference.

BACKGROUND OF THE INVENTION

The present invention relates to a solid-state imaging device such as a CCD type image sensor or a CMOS type image sensor where an on-chip microlens is mounted on a semiconductor chip having plurality of photoelectric conversion elements.

It has been known heretofore that a solid-state imaging device such as a CCD or CMOS type image sensor has a plurality of photodiodes (photoelectric conversion elements) arranged in a two-dimensional array, wherein a signal charge generated by each photodiode is converted into an electric signal by a peripheral element and then is outputted therefrom.

That is, in a CCD type image sensor, a signal charge obtained from each photodiode is transferred by a CCD vertical transfer register and a CCD horizontal transfer register, and then is converted into an electric signal by an FD (floating diffusion) part and a potential detecting MOS transistor provided in a final output stage, and such an electric signal is outputted.

Meanwhile, in a CMOS type image sensor, a gate circuit including a photodiode, an FD part and various MOS transistors is provided per each unit pixel, and a signal charge obtained from the photodiode is converted into an electric signal by the FD part and the potential detecting MOS transistor, and then is delivered to an output signal line.

In such an image sensor, it is necessary to raise the light condensing efficiency toward the photodiode so as to increase the sensitivity, and one of the known methods is carried out by providing an on-chip microlens (OCL) on a semiconductor chip where a solid-state imaging device is mounted.

FIG. 5 is a schematic partial plan view showing an exemplary layout of on-chip microlenses in a conventional solid-state imaging device.

This solid-state imaging device represents the aforementioned CMOS type image sensor, wherein each unit pixel 10 includes a photodiode 12, an FD part 14 and a read gate 16. The read gate 16 reads out the signal charge from the photodiode 12 to the FD part 14.

And the on-chip microlens 18 is positioned on the top surface of the solid-state imaging device via a color filter and so forth.

As shown in FIG. 5, the on-chip microlens 18 is formed into a single convex lens 18A correspondingly to one unit pixel 10.

However, in the above conventional solid-state imaging device where the on-chip microlens 18 is formed into a single convex lens 18A correspondingly to one unit pixel (light receiving part of the photodiode 12) 10, the device functions effectively in case the area of the unit pixel is small, but the following problems arise when the unit pixel has a relatively large area.

First, if a spherical lens is employed in particular for enabling a single convex lens to cover the entire light receiving region of one unit pixel, it is necessary to ensure a large radius of the on-chip microlens, i.e., to increase the height of the microlens, hence requiring a process of machining the microlens by the use of a thick material film to consequently bring about some difficulty in the process control.

Further, the film thickness of the on-chip microlens inclusive of the convex lens is rendered great to eventually exert harmful influence on the light transmittivity.

In order to avoid the disadvantages observed in this spherical lens, there may be contrived a trapezoidal lens structure where a center portion of each convex lens surface is shaped to be flat while only a peripheral edge portion thereof is shaped to have a curvature. However, even in such a shape, it is still impossible to eliminate the difficulty in the process control.

In the conventional solid-state imaging device, there exist the following two problems.

First, in the solid-state imaging device of this kind, any of wiring and the like for the peripheral circuit is not permitted in the light receiving part of the photodiode so as to secure an optical path therein. That is, the circuit wiring needs to be laid out in some other region than the light receiving part of the photodiode, hence enlarging the size of each unit pixel and reducing the aperture ratio which represents the rate of the area of the light receiving part to the pixel size.

Therefore, it is desired to achieve, in the conventional solid-state imaging device, an improved method which is capable of securing a circuit wiring region without sacrificing the area of the light receiving part of the photodiode in each imaging pixel.

In the solid-state imaging device of FIG. 5, a charge-transfer read gate is disposed in the edge of the photodiode (light receiving part). In this case, if the area of the photodiode is large, the read gate fails to overlap the lowest potential point at the time of reading the signal charge, so that the lowest point becomes a potential pocket and the charge transfer is not performed completely. For this reason, it is desired to realize an improved method of laying out the transfer gate in a manner to avoid such a problem.

SUMMARY OF THE INVENTION

It is therefore an object of the present invention to provide a solid-state imaging device adapted for reducing the film thickness of an on-chip microlens with regard to the area of each unit pixel and also for enhancing the light transmission efficiency while facilitating the process control.

And another object of the present invention is to provide a solid-state imaging device adapted for enhancing the light condensing efficiency without sacrificing the area of a light receiving part in each unit pixel, and also for enhancing the circuit wiring efficiency in each unit pixel as well as for avoiding any incomplete charge transfer to consequently improve the picture quality.

In order to achieve the objects mentioned above, the present invention accomplishes improvements in a solid-state imaging device where an on-chip microlens is positioned on a semiconductor chip having a plurality of photoelectric conversion elements, wherein the on-chip microlens has a plurality of lens parts correspondingly to the light receiving part of each photoelectric conversion element.

The present invention further accomplishes improvements wherein a floating diffusion part and a signal-charge read gate for taking out a signal charge from the photoelectric conversion element are provided on a region which is on the light receiving part of the photoelectric conversion element and is positioned in a boundary of each lens part of the on-chip microlens, and a wiring for the floating diffusion part and a wiring for the read gate are provided along the respective boundaries of the lens parts of the on-chip microlens.

In the solid-state imaging device of the present invention where an on-chip microlens having a plurality of lens parts is provided correspondingly to the light receiving part of each photoelectric conversion element, the film thickness of the on-chip microlens can be reduced with regard to the area of each unit pixel, thereby facilitating the process control and enhancing the light transmission efficiency.

Further, in the solid-state imaging device of the invention, as described, a floating diffusion part and a signal-charge read gate for taking out a signal charge from the photoelectric conversion element are provided on a region which is on the light receiving part of the photoelectric conversion element and is positioned in a boundary of each lens part of the on-chip microlens, and a wiring for the floating diffusion part and a wiring for the read gate are provided along the respective boundaries of the lens parts of the on-chip microlens, hence enhancing the light condensing efficiency without sacrificing the area of the light receiving part in each unit pixel, and also enhancing the circuit wiring efficiency in each unit pixel while avoiding any incomplete charge transfer to consequently improve the picture quality.

The above and other features and advantages of the present invention will become apparent from the following description which will be given with reference to the illustrative accompanying drawings.

BRIEF DESCRIPTION OF THE DRAWINGS

FIG. 2 is a circuit diagram showing a circuit configuration of a unit pixel in the solid-state imaging device of FIG. 1;

DESCRIPTION OF THE PREFERRED EMBODIMENTS

Hereinafter, some preferred embodiments of the solid-state imaging device according to the present invention will be described in detail with reference to the accompanying drawings.

In this solid-state imaging device, an on-chip microlens having a plurality of convex lenses is disposed for each unit pixel so that manufacture of the microlenses is rendered easier while enhancing the efficiency of condensing the light incident upon a photoelectric conversion element of each unit pixel, with another advantage of realizing a circuit wiring on the light receiving part in each unit pixel.

Figure 1:
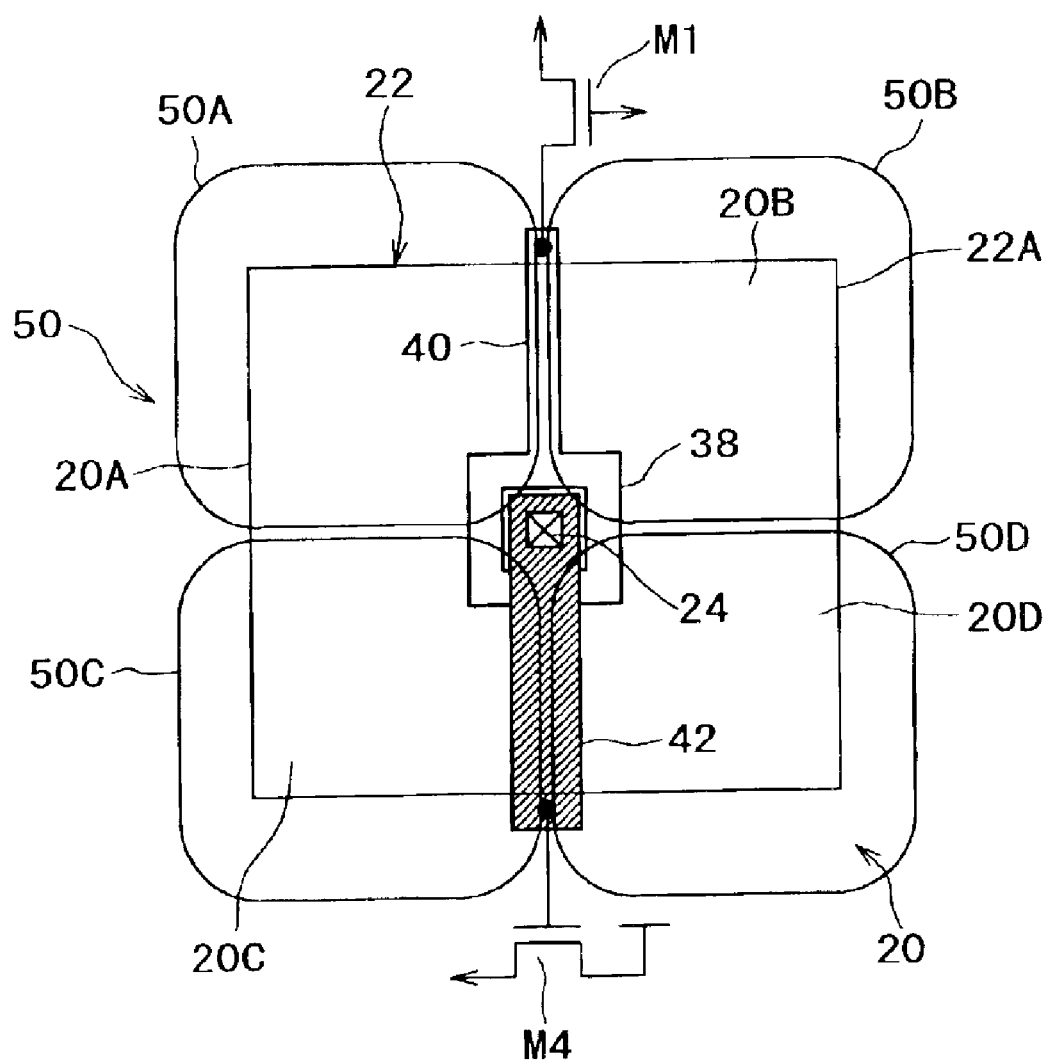
FIG. 1 is a schematic partial plan view showing an exemplary layout of an on-chip microlens in a solid-state imaging device according to a first embodiment of the present invention.

FIG. 1 is a schematic partial plan view showing an exemplary layout of an on-chip microlens in the solid-state imaging device according to a first embodiment of the present invention, and FIG. 2 is a circuit diagram showing a circuit configuration of a unit pixel in the solid-state imaging device of FIG. 1.

The embodiment shown in these diagrams represents one case of applying the present invention to a CMOS type image sensor. Referring first to FIG. 2, an explanation will be given on the structure of a unit pixel in this embodiment.

As shown in FIG. 2, the unit pixel 20 includes one photodiode 22 and five MOS transistors M1–M5.

The photodiode 22 generates a signal charge in proportion to the amount of incident light from a light receiving part and then stores the charge therein. In response to a pulse signal supplied via a transfer line 26 and a column selection line 28, the read transistor M2 and the address transistor M1 transfer the signal charge, which is stored in the photodiode 22, to an FD (floating diffusion) part 24 at predetermined timing.

The amplifier transistor M4 detects a potential change caused in the FD part 24 by the signal charge transferred from the photodiode 22, and then converts the detected potential change into a voltage (current) signal. In response to the pulse signal supplied via a selection line 30, the selection transistor M5 delivers the output signal of the amplifier transistor M4 to a signal line 32. And in response to a reset pulse supplied via a reset line 34, the reset transistor M3 resets the potential of the FD part 24 to a power source potential.

In the solid-state imaging device (CMOS type image sensor) of this embodiment, unit pixels of such a structure are arranged in a two-dimensional array to thereby constitute an effective pixel region, and a vertical-horizontal scanner circuit, a shutter scanner circuit, a signal processing circuit, a bus line and so forth are arranged around the effective pixel region.

And an on-chip microlens is positioned on a semiconductor chip where such a solid-state imaging device is formed.

Referring now to FIG. 1, an explanation will be given on the structure of the unit pixel in the solid-state imaging device according to this embodiment.

The structure of FIG. 1 shows a layout including, out of the entire components in FIG. 2, a photodiode 22 (light receiving part), a read transistor M2 (read gate) and an FD part 24.

In the solid-state imaging device of this embodiment, as shown in the diagram, an on-chip microlens 50 is composed of four convex lens parts 50A, 50B, 50C and 50D correspondingly to one unit pixel 20.

More specifically, the four convex lens parts 50A, 50B, 50C and 50D are disposed correspondingly to four square divided regions 20A, 20B, 20C and 20D which are defined by dividing the square unit pixel 20 both horizontally and vertically, wherein the respective optical axes of the convex lens parts 50A, 50B, 50C and 50D are coincident with the respective centers of the divided regions 20A, 20B, 20C and 20D. The convex lens parts 50A, 50B, 50C and 50D are formed by integral molding of the on-chip microlens 50 and have, for example, a spherical lens face individually.

A read gate 38 of the read transistor M2 and the FD part 24 are formed like isolated islands at the center of the light receiving part 22A of the photodiode 22. In the shown example, the read gate 38 is shaped into a square frame, and the FD part 24 is positioned at the center thereof.

In the pixel structure in the aforementioned conventional solid-state imaging device, the gate 16 of the read transistor is set in the edge of the light receiving part of the photodiode 12. In this embodiment, however, the gate 38 of the read transistor M2 is provided at the center of the light receiving part 22A of the photodiode 22.

Thus, the read transistor M2 is so positioned as to minimize the potential obtained at the charge read time, hence raising the charge transfer speed while avoiding any incomplete charge transfer that may otherwise be caused by the existence of a potential pocket.

In case the gate 38 of the read transistor M2 is set at the center of the light receiving part 22A of the photodiode 22, it is necessary to dispose the control wiring of the gate 38 up to the center of the light receiving part 22A.

Further, since the FD part 24 is also positioned at the center of the light receiving part 22A, it becomes necessary to lead out the wiring from the FD part 24, so that such wiring needs to be disposed up to the center of the light receiving part 22A.

As the wiring usually obstructs the light incident upon the light receiving part 22A, the aperture ratio of the pixel is lowered in practical effect to consequently deteriorate the sensitivity of the sensor.

In order to avoid this problem, as shown in FIG. 1, an on-chip microlens having four convex lens parts 50A, 50B, 50C and 50D is provided correspondingly to one unit pixel 20, and the wiring mentioned above is laid along the respective boundaries of the convex lens parts 50A, 50B, 50C and 50D.

That is, the control wiring 40 for the read gate 38 is laid along the boundaries of the convex lens parts 50A, 50B, 50C and 50D to thereby connect the read gate 38 to the address transistor M1 disposed outside the light receiving part 22A.

The wiring 42 connected to the FD part 24 is laid along the respective boundaries of the convex lens parts 50A, 50B, 50C and 50D to thereby connect the FD part 24 to the amplifier transistor M4 disposed outside the light receiving part 22A.

The control wiring 40 is composed of a metal of high fusion point such as tungsten for example, and the wiring 42 is composed of aluminum for example.

Since the wirings 40 and 42 that block the light are disposed along the respective boundaries of the convex lens parts 50A, 50B, 50C and 50D, the light incident upon the wirings 40 and 42 through the boundaries is reflected by the surfaces of the wirings 40, 42 and is permitted to be incident upon the light receiving part 22A by the convex lens parts 50A, 50B, 50C and 50D which are on both sides in the microlens 50.

Thus, although the wirings 40 and 42 are disposed on the photodiode 22 in this embodiment, these wirings never obstruct the light and therefore the effective aperture can be kept substantially the same in size as the entire area of the light receiving part 22A of the photodiode 22.

Figure 3:
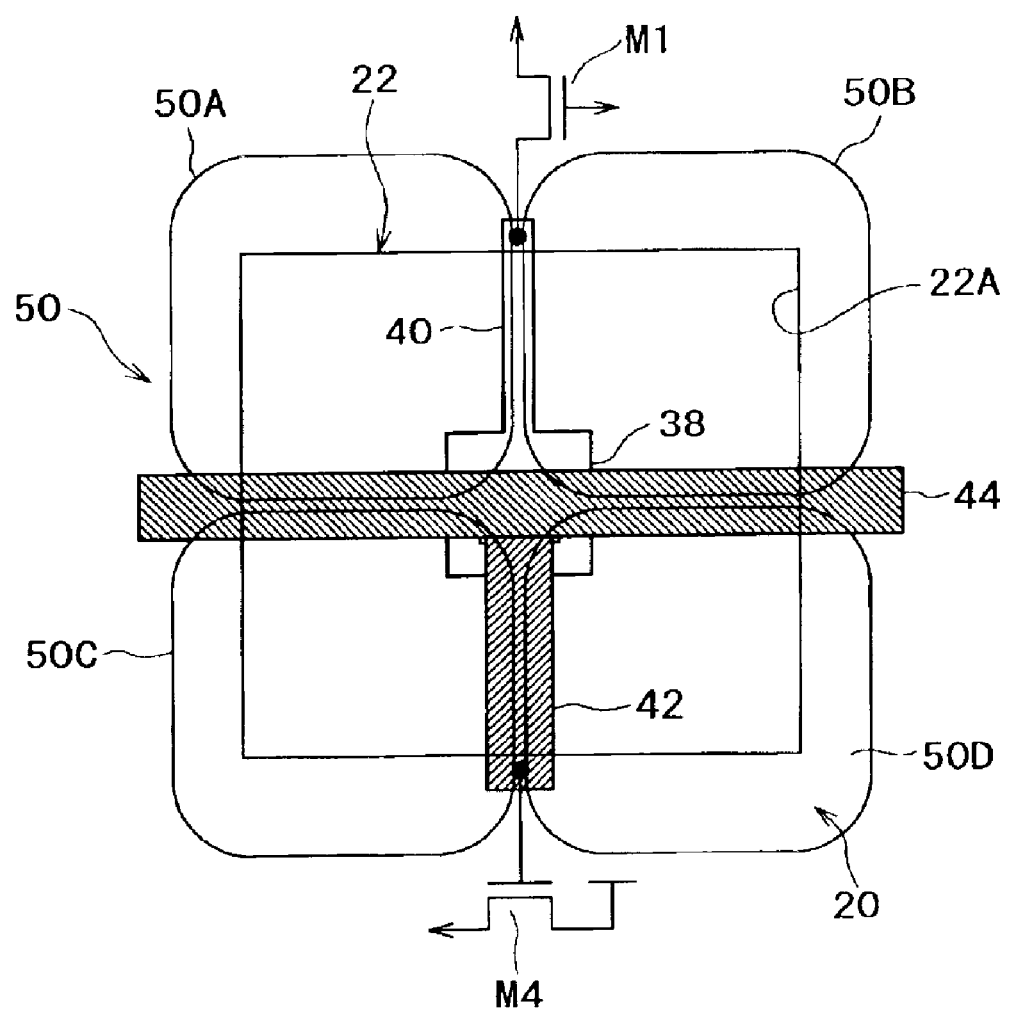
FIG. 3 is a schematic partial plan view showing an exemplary layout of an on-chip microlens in a solid-state imaging device according to a second embodiment of the present invention.

FIG. 3 is a schematic partial plan view showing an exemplary layout of an on-chip microlens in the solid-state imaging device according to a second embodiment of the present invention. Any components common to those shown in FIG. 1 are denoted by the same reference numerals or symbols, and a repeated explanation thereof will be omitted below.

This solid-state imaging device has, in addition to the aforementioned structure of FIG. 1, an upper-layer metal wiring 44 along the respective boundaries of convex lens parts 50A, 50B, 50C and 50D of an on-chip microlens.

The metal wiring 44 is composed of aluminum or the like and is disposed orthogonally to the aforementioned wirings 40 and 42.

More specifically, the wirings 40, 42 and 44 are disposed by using the entire cross boundaries which are formed by the convex lens parts 50A, 50B, 50C and 50D.

Such upper-layer wiring 44 may be utilized for control of the various transistors and also for power supply, grounding or the like.

Figure 4:
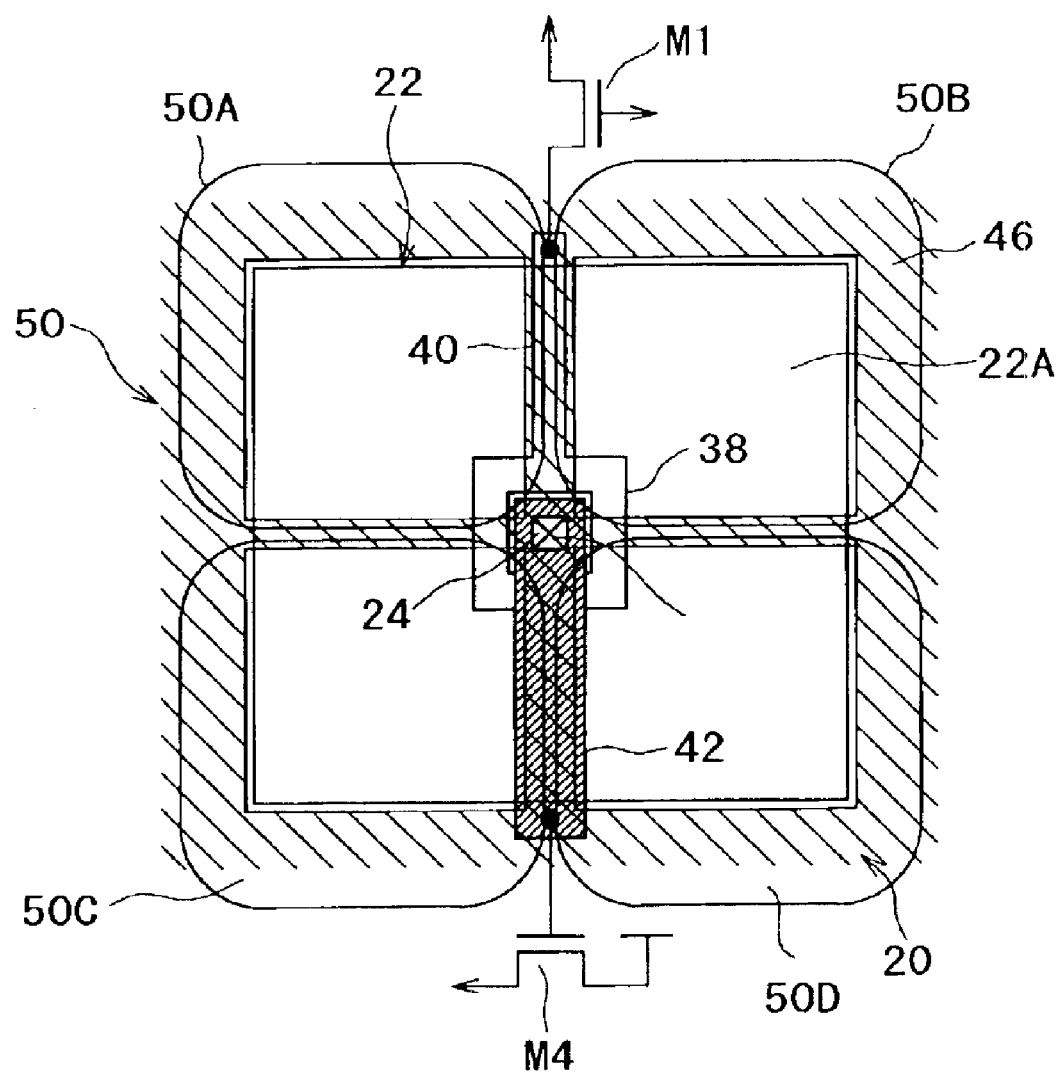
FIG. 4 is a schematic partial plan view showing an exemplary layout of an on-chip microlens in a solid-state imaging device according to a third embodiment of the present invention.
Figure 5:
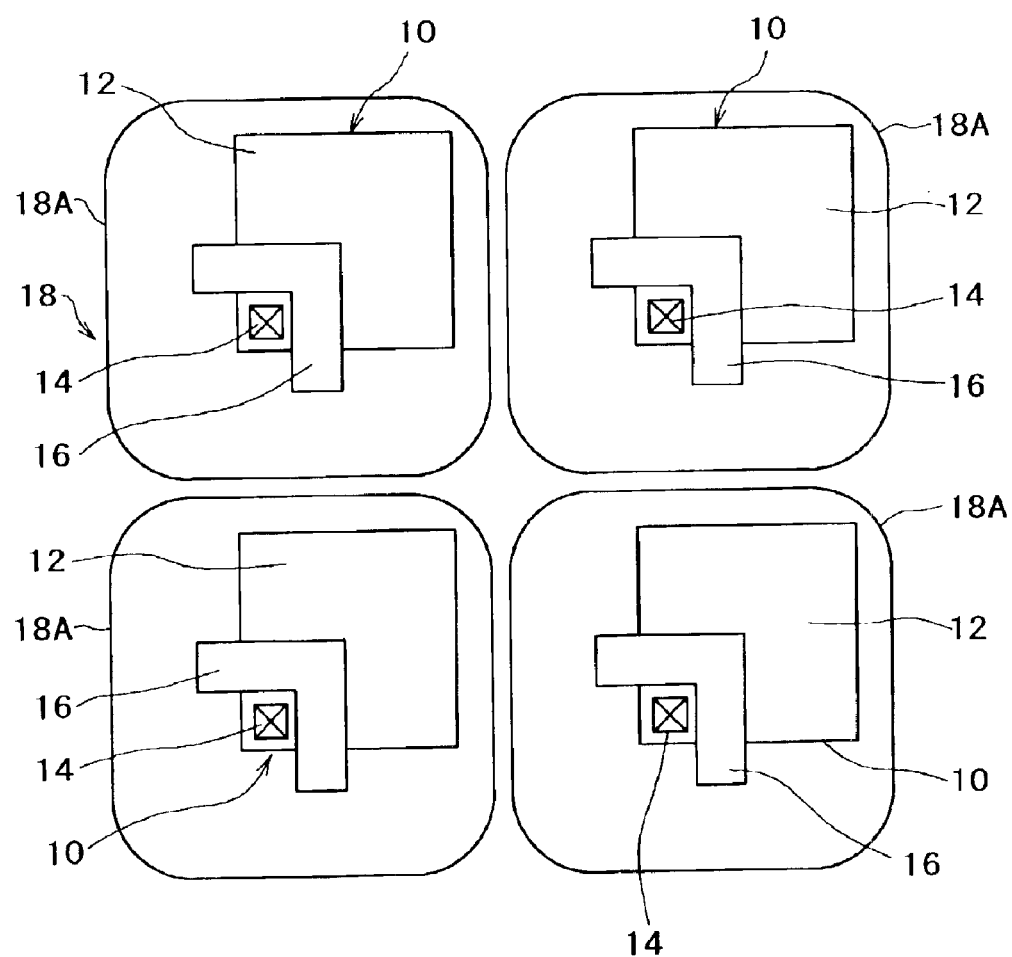
FIG. 5 is a schematic partial plan view showing an exemplary layout of on-chip microlenses in a conventional solid-state imaging device.

FIG. 4 is a schematic partial plan view showing an exemplary layout of an on-chip microlens in the solid-state imaging device according to a third embodiment of the present invention. Any components common to those shown in FIG. 1 are denoted by the same reference numerals or symbols, and a repeated explanation thereof will be omitted below.

This solid-state imaging device has, on a photodiode 22, a cross-shaped light shield wiring 46 formed along the respective boundaries of convex lens parts 50A, 50B, 50C and 50D of the microlens 50 for preventing diffused reflection of the light or any stray light.

The light shield wiring 46 is normally used for power supply and, since it is shaped into a cross, the power supply wiring area can be enlarged to consequently achieve an effect of diminishing the potential fall caused in the case of a current flow.

Due to the structure mentioned above, it becomes possible to set the circuit wirings 40, 42, 44 and 46 on the photodiode 22 without the necessity of changing the light condensing rate, hence saving the peripheral circuit region to eventually raise the aperture ratio of the photodiode 22.

The explanation given above relates to an example where the four convex lens parts 50A, 50B, 50C and 50D are arrayed for a single unit pixel. However, the present invention is not limited to such an example alone, and the structure may be so modified as to dispose two or six convex lens parts.

Further, in addition to a CMOS type image sensor, as described in the above example, the present invention is also applicable to a CCD type image sensor.

While the preferred embodiments of the present invention have been described using the specific terms, such description is for illustrative purposes only, and it is to be understood that changes and variations may be made without departing from the spirit or scope of the following claims.

What is claimed is:

1. A solid-state imaging device having a plurality of unit pixels, each of the pixels comprising:
   photoelectric conversion; and
   a plurality of lenses provided over said photoelectric conversion element,
   wherein a floating diffusion region and a gate for reading out a signal charge from said photoelectric conversion element are provided at one or more boundaries of said plurality of lenses.

2. The solid-state imaging device according to claim 1, wherein said boundaries are substantially at a center of said photoelectric conversion element.

3. The solid-state imaging device according to claim 1, wherein a wiring connected to said floating diffusion region and a wiring connected to said gate are formed at one or more boundaries of said plurality of lenses.

4. A solid-state imaging device having a plurality of unit pixels, each pixel comprising:
   a photodiode formed over or in a substrate;
   a first transistor connected to said photodiode; and
   a second transistor whose control electrode is connected to said first transistor;

wherein there is a plurality of lenses formed over said photodiode and further, wherein a floating diffusion region is formed between said first and second transistors.

5. A solid-state imaging device having a plurality of unit pixels comprising:

a photodiode formed over or in a substrate;

a first transistor connected to said photodiode; and a second transistor whose control electrode is connected to said first transistor;

wherein there is a plurality of lenses formed over the photodiode and further, wherein a floating diffusion region and a gate for reading out a signal charge from said photodiode are provided at one or more boundaries of said plurality of lenses.

6. The solid-state imaging device according to claim 5, wherein a wiring connected to said floating diffusion region and a wiring connected to said gate are formed at some of the boundaries between said plurality of lenses.

7. The solid-state imaging device according to claim 4, further having a third transistor connected to said first and second transistors.

8. The solid-state imaging device according to claim 7, wherein said third transistor is used for resetting the potential of said floating diffusion.

9. The solid-state imaging device according to claim 7, wherein said first, second and third transistors are formed on or in the same substrate where said photodiode is provided.

10. The solid-state imaging device according to claim 9, wherein a scanner circuit for controlling said third transistor is formed on the same substrate.

11. A solid-state imaging device having a plurality of unit pixels, each pixel comprising:

a photoelectric conversion means formed to convert an external light signal into an electric signal;

a read transistor connected to said photoelectric conversion means for reading out the signal from said photoelectric conversion means;

an amplifier transistor having a control electrode connected to said read transistor, and serving to amplify the signal obtained from said read transistor; and a reset transistor for resetting a connection node of said read transistor and said amplifier transistor;

wherein said photoelectric conversion means of the unit pixels are arrayed in the shape of a matrix, and a plurality of convex lenses are formed over each of said photoelectric conversion means;

wherein a floating diffusion region and a control part for reading out a signal charge from said photoelectric conversion means are provided at at least one of the boundaries of said plurality of convex lenses; and a wiring connected to said floating diffusion region and a wiring connected to said control part are formed at at least one of the boundaries of said plurality of convex lenses.

12. A solid-state imaging device having a plurality of unit pixels, each of the pixels comprising:

a photoelectric conversion means formed on or in a substrate to convert an external light signal into an electric signal;

a read transistor connected to said photoelectric conversion means for reading out the signal from said photoelectric conversion means;

an amplifier transistor having a control electrode connected to said read transistor, and serving to amplify the signal obtained from said read transistor; and a reset transistor for resetting a connection node of said read transistor and said amplifier transistor;

wherein said photoelectric conversion means for the unit pixels are arrayed in the shape of a matrix, and a plurality of convex lenses are formed on each of said photoelectric conversion means; and further comprising an address transistor connected to the control electrode of said read transistor; and a selection transistor connected to said amplifier transistor.

13. The solid-state imaging device according to claim 11, wherein a power supply wiring adapted for supplying electric power and reflecting external light is located in a periphery of said photoelectric conversion means.

14. The solid-state imaging device according to claim 6, wherein a power supply wiring adapted for supplying electric power and reflecting external light is located in a periphery of said photodiode.

* * * * *